US010205056B2

(12) United States Patent
Li et al.

(10) Patent No.: US 10,205,056 B2
(45) Date of Patent: Feb. 12, 2019

(54) LIGHT EMITTING DIODE HAVING CARBON NANOTUBES

(71) Applicants: Tsinghua University, Beijing (CN); HON HAI PRECISION INDUSTRY CO., LTD., New Taipei (TW)

(72) Inventors: Qun-Qing Li, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/636,584

(22) Filed: Jun. 28, 2017

(65) Prior Publication Data
US 2017/0301827 A1 Oct. 19, 2017

Related U.S. Application Data

(63) Continuation of application No. 14/678,186, filed on Apr. 3, 2015, now Pat. No. 9,748,444, and a (Continued)

(30) Foreign Application Priority Data

Nov. 28, 2008 (CN) .......................... 2008 1 0217913

(51) Int. Cl.
*H01L 33/38* (2010.01)
*B82Y 20/00* (2011.01)
(Continued)

(52) U.S. Cl.
CPC .............. *H01L 33/38* (2013.01); *B82Y 20/00* (2013.01); *H01L 33/10* (2013.01); *H01L 33/12* (2013.01);
(Continued)

(58) Field of Classification Search
CPC ......... B82Y 30/00; B82Y 10/00; B82Y 40/00; H01L 51/0048; H01L 33/42;
(Continued)

(56) References Cited

U.S. PATENT DOCUMENTS 6,486,500 B1 * 11/2002 Chen ................... H01L 33/0033
257/79
7,173,289 B1 * 2/2007 Wu ......................... H01L 33/20
257/79
(Continued)

OTHER PUBLICATIONS

Coluci et al., Mechanical properties of carbon nanotube networks by molecular mechanics and impact molecular dynamics calculations, Feb. 16, 2007, The American Physical Society, Physical Review B 75, 075417 (1-7).*

*Primary Examiner* — David Chen
(74) *Attorney, Agent, or Firm* — ScienBiziP, P.C.

(57) ABSTRACT

A light emitting diode includes a substrate, a first semiconductor layer, an active layer, a second semiconductor layer, a first electrode, a second electrode, a static electrode and a carbon nanotube structure. The first semiconductor layer, the active layer, and the second semiconductor layer are stacked on the substrate. The first electrode is located on and electrically connected to the first semiconductor layer. The carbon nanotube structure is located on and electrically connected to the second semiconductor layer. The second electrode is located on and electrically connected to the carbon nanotube structure. The static electrode is located between the second semiconductor layer and the carbon nanotube structure. The carbon nanotube structure includes a first portion in direct contact with the second semiconductor layer and a second portion sandwiched between the static electrode and the second electrode.

17 Claims, 9 Drawing Sheets

Related U.S. Application Data continuation of application No. 12/584,417, filed on Sep. 3, 2009, now abandoned.

(51) Int. Cl.
| | | |
|---|---|---|
| *H01L 33/42* | (2010.01) | |
| *H01L 33/12* | (2010.01) | |
| *H01L 33/20* | (2010.01) | |
| *H01L 33/46* | (2010.01) | |
| *H01L 33/10* | (2010.01) | |
| *H01L 33/16* | (2010.01) | |
| *H01L 33/40* | (2010.01) | |
| *B82Y 30/00* | (2011.01) | |
| *H01L 51/00* | (2006.01) | |
| *B82Y 40/00* | (2011.01) | |
| *H01L 29/06* | (2006.01) | |
| *H01L 33/06* | (2010.01) | |
| *H01L 33/32* | (2010.01) | |

(52) U.S. Cl.
 CPC .............. *H01L 33/16* (2013.01); *H01L 33/20* (2013.01); *H01L 33/40* (2013.01); *H01L 33/42* (2013.01); *H01L 33/46* (2013.01); *B82Y 30/00* (2013.01); *B82Y 40/00* (2013.01); *H01L 29/0676* (2013.01); *H01L 33/06* (2013.01); *H01L 33/32* (2013.01); *H01L 51/0048* (2013.01); *Y10S 977/742* (2013.01); *Y10S 977/95* (2013.01)

(58) Field of Classification Search
 CPC ......... H01L 29/2003; H01L 2221/1094; H01L 29/0676; H01L 33/387; Y10S 977/742; Y10S 977/762
 USPC .............................. 257/79, 98; 977/742, 938
 See application file for complete search history.

(56) References Cited

U.S. PATENT DOCUMENTS

| | | | | |
|---|---|---|---|---|
| 2004/0038007 | A1* | 2/2004 | Kotov | B01D 67/0079 428/174 |
| 2004/0079948 | A1* | 4/2004 | Chen | H01L 33/14 257/79 |
| 2005/0199894 | A1* | 9/2005 | Rinzler | B82Y 10/00 257/94 |
| 2005/0199895 | A1* | 9/2005 | Seong | H01L 33/40 257/94 |
| 2008/0035909 | A1* | 2/2008 | Lu | B82Y 20/00 257/13 |

* cited by examiner

US 10,205,056 B2

LIGHT EMITTING DIODE HAVING CARBON NANOTUBES

RELATED APPLICATIONS

This application is a continuation application of U.S. patent application Ser. No. 14/678,186, filed on Apr. 3, 2015, entitled "LIGHT EMITTING DIODE HAVING CARBON NANOTUBES," which is a continuation application of U.S. patent application Ser. No. 12/584,417, filed on Sep. 3, 2009, entitled "LIGHT EMITTING DIODE HAVING CARBON NANOTUBES," which claims all benefits accruing under 35 U.S.C. § 119 from China Patent Applications: Application No. 200810217913.3, filed on Nov. 28, 2008 in the China Intellectual Property Office, disclosures of which are incorporated herein by references.

BACKGROUND

1. Technical Field

The present disclosure relates to a light emitting diode (LED).

2. Description of the Related Art

LEDs are semiconductors that convert electrical energy into light. Compared to conventional light sources, the LEDs have higher energy conversion efficiency, higher radiance (i.e., they emit a larger quantity of light per unit area), longer lifetime, higher response speed, and better reliability. At the same time, LEDs generate less heat. Therefore, LED modules are widely used in particular as a semiconductor light source in conjunction with imaging optical systems, such as displays, projectors, and so on.

Referring to FIG. 6, a typical LED 10, according to the prior art includes a substrate 110, a GaN bumper layer 120, an N-type GaN layer 132, an active layer 134, a P-type GaN layer 136, and a transparent contact layer 140. The GaN bumper layer 120, the N-type GaN layer 132, the active layer 134, the P-type GaN layer 136, and the transparent contact layer 140 are stacked on the substrate 110. The LED 10 further includes a transparent conductive layer 150, a first electrode 142, and a second electrode 144. The first electrode 142 is disposed on the N-type semiconductor layer 132. The transparent conductive layer 150 and the second electrode 144 are disposed on the transparent contact layer 140. The transparent conductive layer 150 is made of indium tin oxide (ITO) and the ITO is sputtered on an area of the transparent contact layer 140. Due to the net structure of the ITO layer, the lateral distribution of current applied on the transparent conductive layer 150 is uniform, thereby improving the extraction efficiency of light of the LED. However, the ITO layer has some faults, such as low mechanical strength and resistance distribution. Furthermore, the transparency of the ITO layer may be decreased in humid environments and the ITO layer may absorb some of the light emitted by the active layer 134 when the ITO fully covers the P-type semiconductor layer 136.

What is needed, therefore, is a light emitting diode, which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
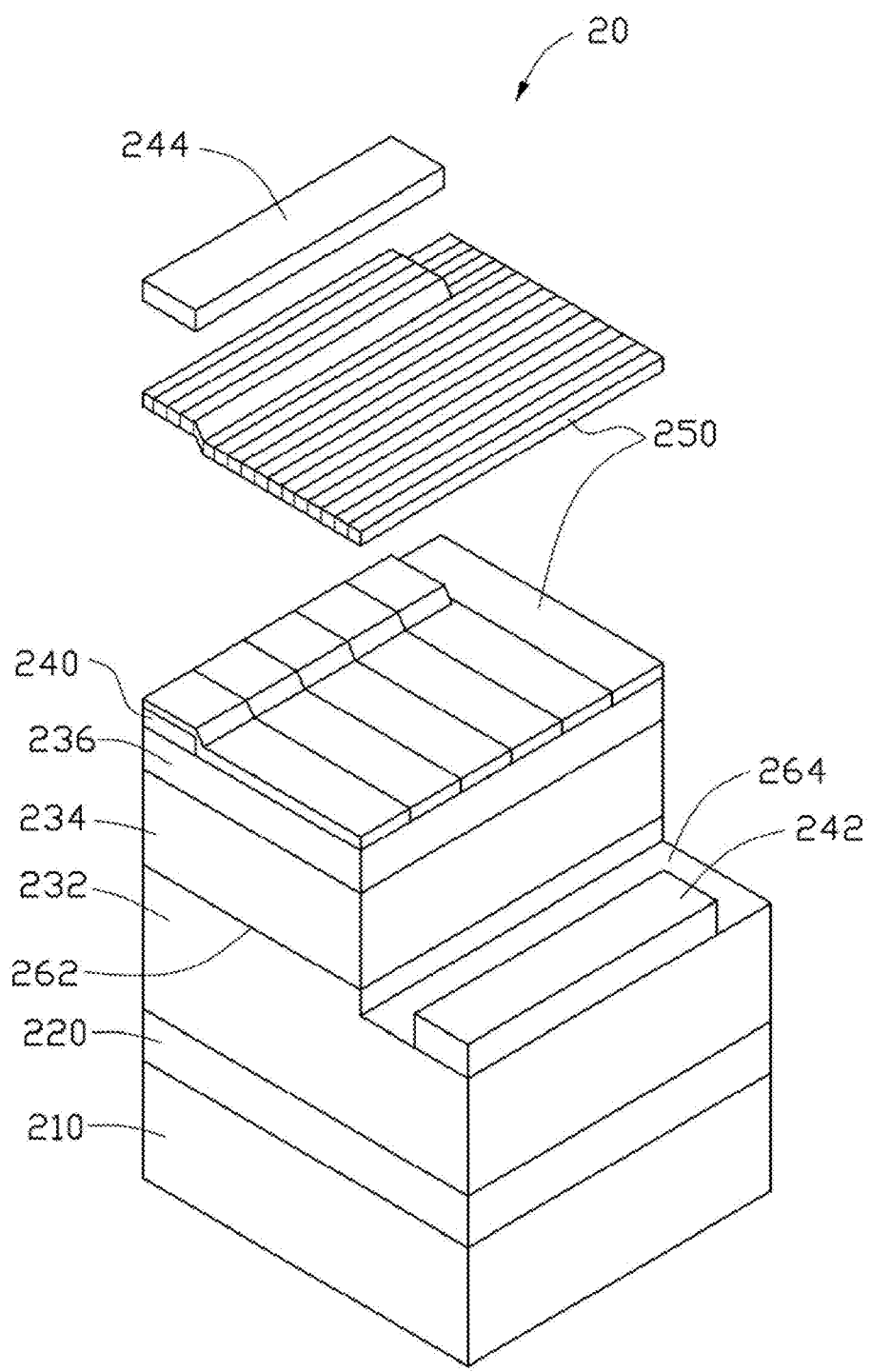
FIG. 1 is a schematic, partial exploded view of a light emitting diode according to an embodiment.
Figure 2:
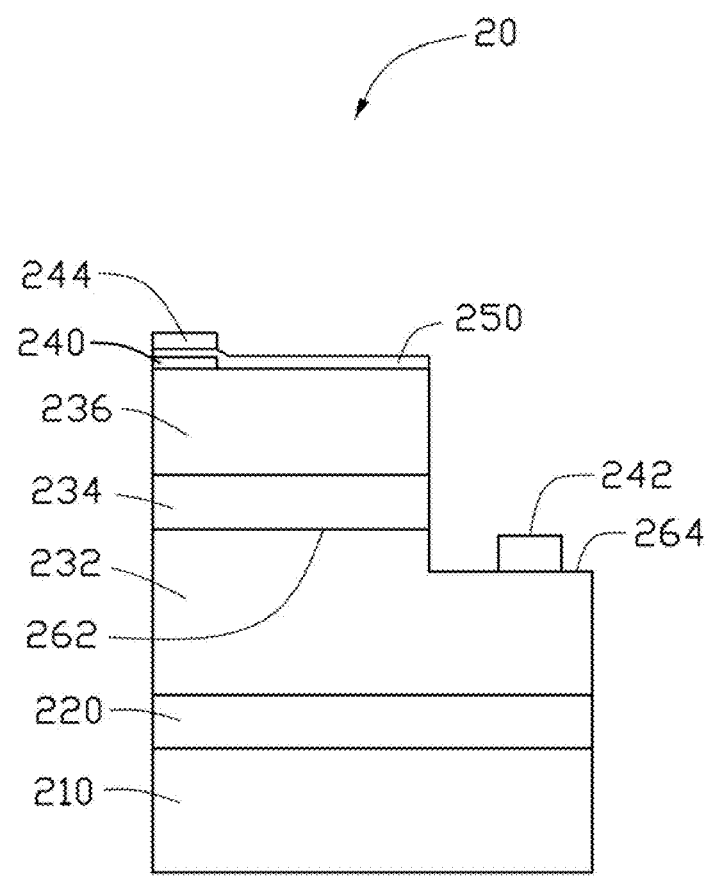
FIG. 2 is a schematic view of the light emitting diode of FIG. 1.

Referring to FIG. 1 and FIG. 2, a first embodiment of a light emitting diode (LED) 20 includes a substrate 210, a first semiconductor layer 232, an active layer 234, a second semiconductor layer 236, a first electrode 242, a second electrode 244, a transparent conductive layer 250, and a static electrode 240. The first semiconductor layer 232, the active layer 234, the second semiconductor layer 236 are orderly stacked on the substrate 210. The first electrode 242 is electrically connected to the first semiconductor layer 232. The transparent conductive layer 250 is disposed on the top surface of the second semiconductor layer 236 and electrically connected to the second semiconductor layer 236. The static electrode 240 is interposed between the second semiconductor layer 236 and the transparent conductive layer 250. The second electrode 244 is disposed on the top surface of the transparent conductive layer 250 and electrically connected to the transparent conductive layer 250.

The substrate 210 may have a thickness of about 300 microns ($\mu m$) to about 500 $\mu m$ and a transparent plate for supporting the other elements, such as the first and second semiconductor layers 232, 236. The substrate 210 may be made of sapphire, gallium arsenide, indium phosphate, silicon nitride, gallium nitride, zinc oxide, aluminum silicon nitride, silicon carbon, or their combinations. In one embodiment, the substrate 210 is made of sapphire and has a thickness of 400 $\mu m$.

The first semiconductor layer 232, the active layer 234, and the second semiconductor layer 236 can be stacked on the substrate 210 via a process of metal organic chemical vapor deposition (MOCVD).

The first semiconductor layer 232 has a thickness of about 1 $\mu m$ to about 5 $\mu m$. The second semiconductor layer 236 has a thickness of about 0.1 $\mu m$ to about 3 $\mu m$. When the first semiconductor layer 232 is an N-type semiconductor, the second semiconductor layer 236 is a P-type semiconductor, and vice versa. In one embodiment, the first semiconductor layer 232 is an N-type semiconductor and the second semiconductor layer 236 is a P-type semiconductor. The first semiconductor layer 232 has a step-shaped structure and includes a first surface 262 and a second surface 264 located on the same side as the first surface 262. The first surface 262 and the second surface 264 have different heights and form a step-shaped structure. The active layer 234 and the second semiconductor layer 236 are arranged on the first surface 262.

The first semiconductor layer 232 is configured to provide electrons, and the second semiconductor layer 236 is configured to provide cavities. When a voltage is applied to the first and second semiconductor layers 232, 236, the electrons can flow into the second semiconductor 236 and incorporate with the cavities, thereby emitting light. The first semiconductor layer 232 may be made of N-type gallium nitride, N-type gallium arsenide, or N-type copper phosphate. The second semiconductor layer 236 may be made of P-type gallium nitride, P-type gallium arsenide, or P-type copper phosphate. In one embodiment, the first semiconductor layer 232 is made of N-type gallium nitride and has a thickness of 2 µm, and the second semiconductor layer 236 is made of P-type gallium nitride and has a thickness of 0.3 µm.

The active layer 234, in which the electrons fill the holes, has a thickness of about 0.01 µm to about 0.6 µm. The active layer 234 is a photon exciting layer and can be one of a single quantum well layer or multilayer quantum well films. The active layer 140 can be made of GaInN, AlGaInN, GaSn, AlGaSn, GaInP, or GaInSn. In one embodiment, the active layer 234 has a thickness of 0.3 µm and includes one layer of GaInN stacked with a layer of GaN.

The static electrode 240 is formed on the top surface of the second semiconductor layer 236. The static electrode 240 may be a P-type electrode or an N-type electrode and is a same type as the second semiconductor layer 236. Therefore, in one embodiment, the static electrode 240 is a P-type electrode. Understandably, the static electrode 240 can function as a reflection layer. The static electrode 240 can have one or more layers of metal and may be made of titanium, aluminum, nickel, gold, or any combinations thereof. In one embodiment, the static electrode 240 has two layers. One layer is made of titanium and has a thickness of 15 nanometers (nm). The other layer is made of gold and has a thickness of 100 nm. The static electrode 240 is formed on the second semiconductor layer 236 via a process of physical vapor deposition, such as electron evaporation, vacuum evaporation, ion sputtering, or the like.

Further, a functioning layer may be formed between the substrate 210 and the first semiconductor layer 232. The functioning layer may be one or more of a buffer layers, a reflective layer, and a photon crystal structure. The buffer layer is configured to improve epitaxial growth and decrease lattice mismatch. The buffer layer may be made of GaN, AlN, or the like. The reflective layer is configured to change the transmission route of the light to improve extraction efficiency of light in the LED. The reflective layer may be made of silver, aluminum, rhodium, or the like. The photon crystal structure is configured to improve extraction efficiency of light and may be made of silicon, indium tin oxide, carbon nanotube, or the like. In one embodiment, only the buffer layer 220 is formed on the substrate 210 and is made of GaN. The buffer layer 220 has a thickness of about 20 nm to about 50 nm.

The transparent conductive layer 250 includes a carbon nanotube structure. The transparent conductive layer 250 can be directly applied to the top surface of the second semiconductor layer 236 and the static electrode 240. The transparent conductive layer 250 may only cover the exposed surface of the second semiconductor layer 236 and fully or partly cover both the top surface of the static electrode 240 and the second semiconductor layer 236. In one embodiment, the transparent conductive layer 250 fully covers both the second semiconductor layer 236 and the static electrode 240. The carbon nanotube structure may include at least one carbon nanotube film and/or a number of carbon nanotube wires. The use of all types of carbon nanotube films and/or carbon nanotube wires is envisioned to be employed by the transparent conductive layer 250. There is no particular restriction on the thickness of the carbon nanotube structure and it may be appropriately selected depending on the purpose, and may be, for example, greater than 0.5 nm, and more specifically from about 0.5 µm to 200 µm.

The carbon nanotube structure can include one or more layers of carbon nanotube films. When the carbon nanotube structure includes a number of carbon nanotube films, the carbon nanotube films are stacked on top of each other. The carbon nanotube structure can employ more carbon nanotube films to increase the tensile strength of the carbon nanotube composite. The carbon nanotube film has a thickness in an approximate range from about 0.5 nm to about 100 mm. The carbon nanotubes films may have a free-standing structure. The film structure being supported by itself and does not require a substrate to maintain its structural integrity. As an example, a corner of the carbon nanotube film can be lifted without resulting in damage to the entire structure.

Figure 3:
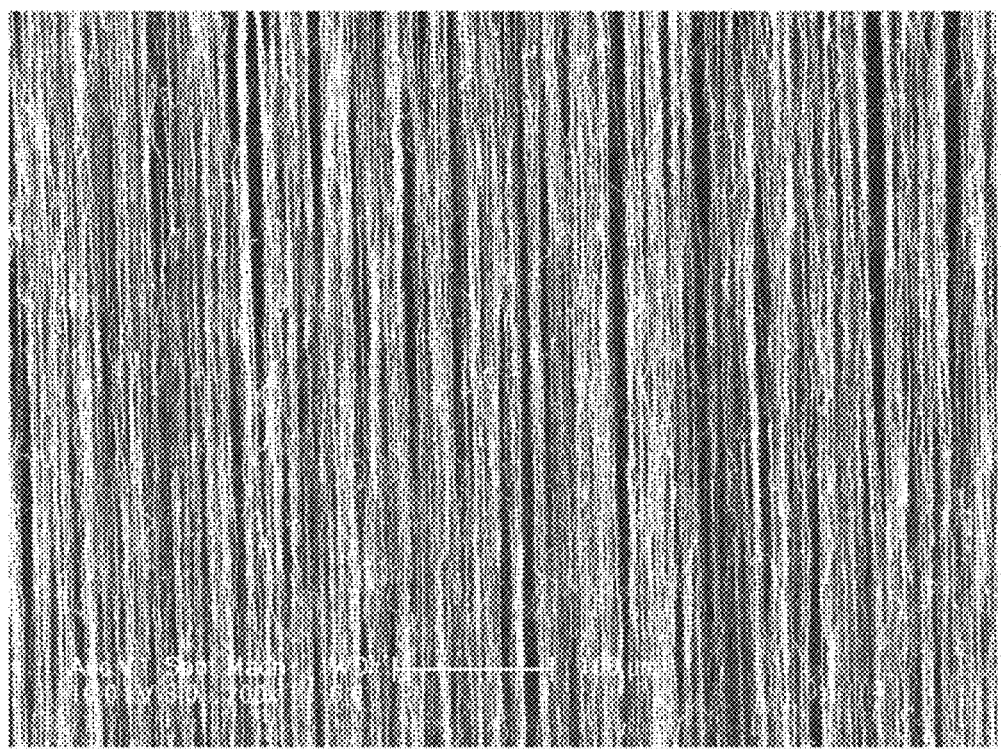
FIG. 3 is a scanning electron microscope (SEM) image of a carbon nanotube film used in the light emitting diode of FIG. 1.
Figure 7:
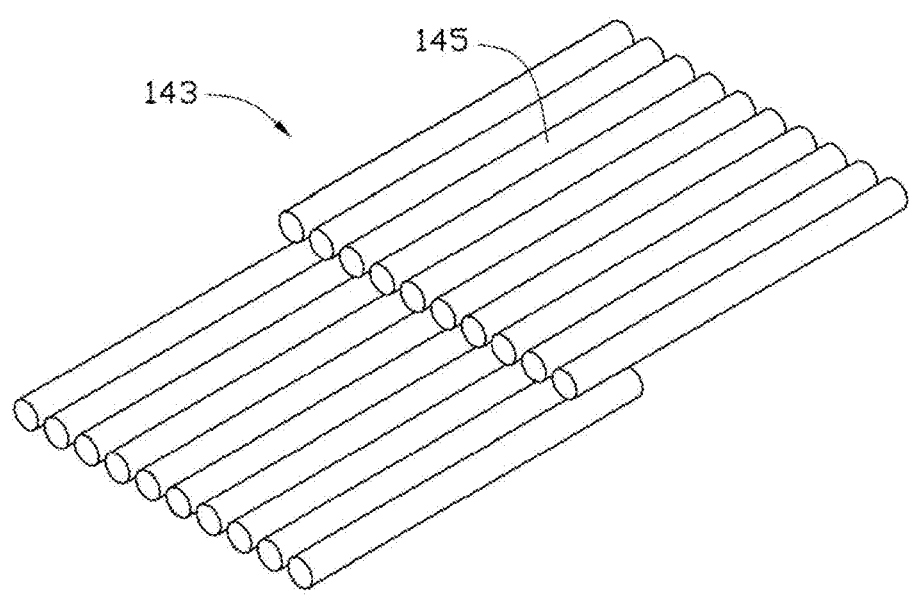
FIG. 7 is a schematic structural view of a carbon nanotube segment of the drawn carbon nanotube film.

Referring to FIG. 3, the carbon nanotube films each is formed by the carbon nanotubes, orderly or disorderly, and has substantially a uniform thickness. Ordered carbon nanotube films include films where the carbon nanotubes are arranged along a primary direction. Examples include films wherein the carbon nanotubes are arranged approximately along a same direction or have two or more sections within each of which the carbon nanotubes are arranged approximately along a same direction (different sections can have different directions). In the ordered carbon nanotube films, the carbon nanotubes are oriented along the same preferred orientation and approximately parallel to each other. A film can be drawn from a carbon nanotube array, to form the ordered carbon nanotube film, namely a drawn carbon nanotube film. Examples of drawn carbon nanotube film are taught by U.S. Pat. No. 7,045,108 to Jiang et al., and WO 2007015710 to Zhang et al. Referring to FIG. 7, the drawn carbon nanotube film 143 includes a plurality of successive and oriented carbon nanotubes 145 joined end-to-end by van der Waals attractive force therebetween. The drawn carbon nanotube film 143 is a free-standing film. The carbon nanotube film 143 can be treated with an organic solvent to increase the mechanical strength and toughness of the carbon nanotube film 143 and reduce the coefficient of friction of the carbon nanotube film 143. A thickness of the carbon nanotube film 143 can range from about 0.5 nanometers to about 100 micrometers.

The ordered carbon nanotube film may be a pressed carbon nanotube film having a number of carbon nanotubes arranged along a same direction. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is 0 degree to approximately 15 degrees. The greater the pressure applied, the smaller the angle formed. The thickness of the pressed carbon nanotube film ranges from about 0.5 nm to about 1 mm. Examples of pressed carbon nanotube film are taught by US application 20080299031A1 to Liu et al.

The disordered carbon nanotube film comprises carbon nanotubes arranged in a disorderly fashion. Disordered carbon nanotube films include randomly aligned carbon nanotubes. When the disordered carbon nanotube film comprises of a film wherein the number of the carbon nanotubes aligned in every direction is substantially equal, the disordered carbon nanotube film can be isotropic. The disordered carbon nanotubes can be entangled with each other and/or are substantially parallel to a surface of the disordered carbon nanotube film. The disordered carbon nanotube film may be a flocculated carbon nanotube film. The flocculated carbon nanotube film can include a plurality of long, curved, disordered carbon nanotubes entangled with each other. The carbon nanotubes can be substantially uniformly dispersed in the flocculated carbon nanotube film. Adjacent carbon nanotubes are attracted by van der Waals attractive force to form an entangled structure with micropores defined therein. It is understood that the flocculated carbon nanotube film is very porous. Sizes of the micropores can be less than 10 µm. Due to the carbon nanotubes in the flocculated carbon nanotube film being entangled with each other, the carbon nanotube structure employing the flocculated carbon nanotube film has excellent durability, and can be fashioned into desired shapes with a low risk to the integrity of the flocculated carbon nanotube film. The thickness of the flocculated carbon nanotube film can range from about 0.5 nm to about 1 millimeter (mm).

The disordered carbon nanotube film may be a pressed carbon nanotube film having a number of carbon nanotubes arranged along different directions. The pressed carbon nanotube film can be a free-standing carbon nanotube film. When the carbon nanotubes in the pressed carbon nanotube film are arranged along different directions, the pressed carbon nanotube film can be isotropic. As described above, the thickness of the pressed carbon nanotube film ranges from about 0.5 nm to about 1 mm. Examples of pressed carbon nanotube film are taught by US application 20080299031A1 to Liu et al.

Length and width of the carbon nanotube film can be arbitrarily set as desired. A thickness of the carbon nanotube film is in a range from about 0.5 nm to about 100 µm. The carbon nanotubes in the carbon nanotube film can be single-walled, double-walled, multi-walled carbon nanotubes, and combinations thereof. Diameters of the single-walled carbon nanotubes, the double-walled carbon nanotubes, and the multi-walled carbon nanotubes can, respectively, be in the approximate range from about 0.5 nm to about 50 nm, about 1 nm to about 50 nm, and about 1.5 nm to about 50 nm.

The carbon nanotube structure include a number of carbon nanotube wires. The carbon nanotube wires may be arranged side by side on the top surface of the second semiconductor layer or may be weaved into a carbon nanotube layer. The weaved carbon nanotube layer is applied to the second semiconductor layer. The carbon nanotube wire includes untwisted carbon nanotube wire and twisted carbon nanotube wire. The untwisted carbon nanotube wire includes a number of carbon nanotubes parallel to each other. The twisted carbon nanotube wire includes a number of carbon nanotube helically twisted along a longitudinal axis of the twist carbon nanotube wire. In other embodiments, the carbon nanotube structure includes a drawn carbon nanotube film, the drawn carbon nanotube film includes a plurality of carbon nanotubes, the carbon nanotubes are substantially parallel to each other. The carbon nanotube structure includes at least one carbon nanotube film, the carbon nanotube film includes a plurality of carbon nanotubes joined by van der Waals force. In one embodiment, the carbon nanotube structure includes two drawn carbon nanotube films, and an angle between aligned directions of the drawn carbon nanotube films is approximately 90 degrees. The drawn carbon nanotube film includes a plurality of carbon nanotube segments joined end to end by van der Waals force along an axial direction of the carbon nanotubes.

The untwisted carbon nanotube wire can be formed by treating the drawn carbon nanotube film with an organic solvent. The drawn carbon nanotube film is treated by applying the organic solvent to the carbon nanotube film while being free to bundle. After being soaked by the organic solvent, the adjacent paralleled carbon nanotubes in the drawn carbon nanotube film will bundle together, due to the surface tension of the organic solvent when the organic solvent volatilizing, and thus, the drawn carbon nanotube film will be shrunk into untwisted carbon nanotube wire. The carbon nanotubes of the untwisted carbon nanotube wires are substantially parallel to each other along the longitudinal axis of the untwisted carbon nanotube wires. Examples of the untwisted carbon nanotube wire are taught by U.S. Pat. No. 7,045,108 to Fan et al. and US publication No. 20070166223 to Fan et al.

The twisted carbon nanotube wire can be formed by twisting a drawn carbon nanotube film by using a mechanical force to turn the two ends of the drawn carbon nanotube film in opposite directions. Further, the twisted carbon nanotube wire can be treated by applying the organic solvent. After applying the organic solvent, the adjacent carbon nanotubes in the twisted carbon nanotube film will bundle together, due to the surface tension of the organic solvent when the organic solvent volatilizing, and thus, the twisted carbon nanotube wire may have less specific surface area, and larger density and strength than an untreated twisted carbon nanotube wire.

The transparent conductive layer 250 may be made by steps of forming a metal layer (not shown) on the carbon nanotube structure and heating the metal layer in a temperature of about 300 degrees centigrade to about 500 degrees centigrade for about 3 minutes to about 10 minutes. The metal layer may be a single-layer structure or a multi-layered structure. In one embodiment, the metal layer includes a nickel layer stacked with a gold layer. The nickel layer has a thickness of about 2 nm. The gold layer has a thickness of 5 nm. Since the metal layer decreases in thickness because of the heating, the metal molecule of the metal layer can be melted and can aggregate into a number of metal particles by surface tension. The carbon nanotube structure has a plurality of micropores between adjacent carbon nanotubes of the carbon nanotube structure. These metal particles uniformly disperse in the micropores of the carbon nanotube structure to form a composite film. The composite film, which functions as the transparent conductive layer 250, has better electrical conductivity than the pure carbon nanotube structure, thereby improving current injection efficiency and electrical contact between the carbon nanotube structure and the static electrode 240, the first electrode 242, and the second semiconductor layer 236.

Figure 8:
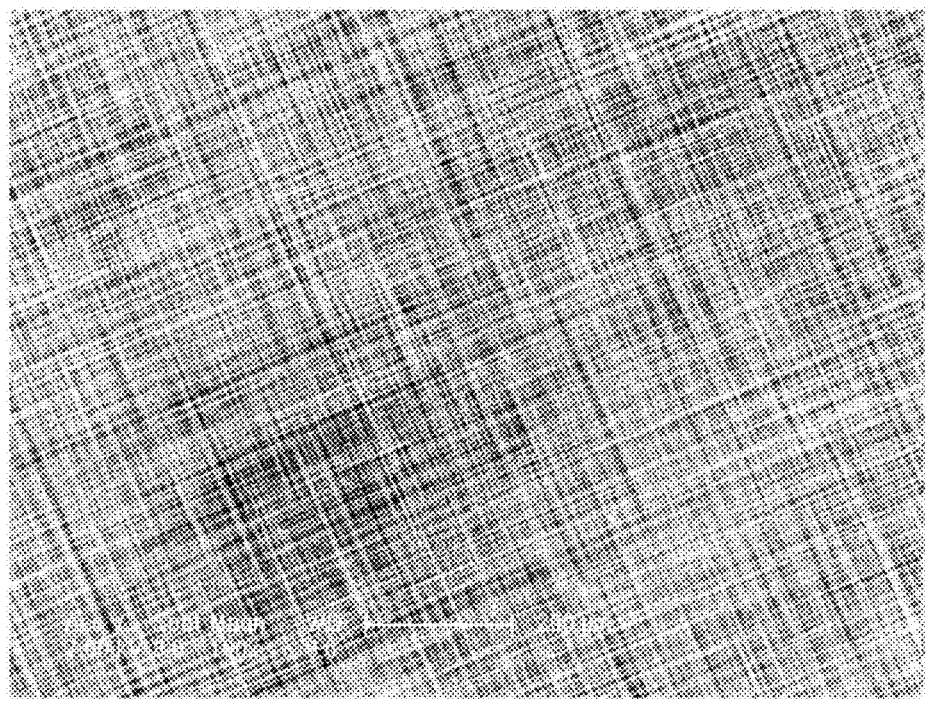
FIG. 8 is a SEM image of two cross-stacked drawn carbon nanotube films.
Figure 9:
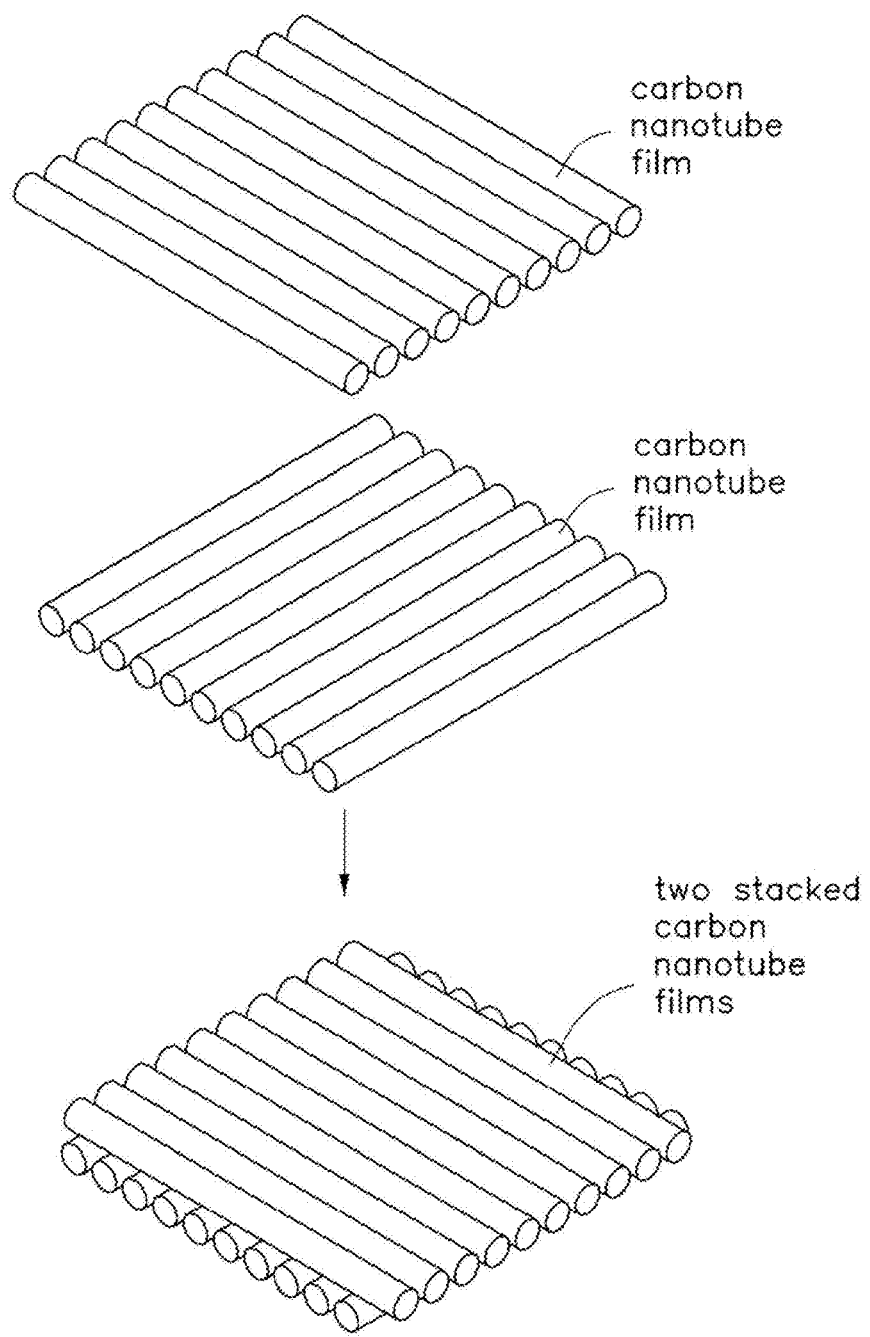
FIG. 9 is a schematic view of two cross-stacked drawn carbon nanotube films.

In one embodiment, two drawn carbon nanotube films are coated on the second semiconductor layer 236 and the static electrode 240. An angle between the primary directions of the two drawn carbon nanotube films ranges from about 0 degrees to about 90 degrees. In one embodiment, the primary directions of the two drawn carbon nanotube films are perpendicular to each other as shown in FIGS. 8 and 9.

The second electrode 244 can be deposited on the transparent conductive layer 250 via physical vapor deposition and may have single-layer structure or multi-layered structure. The second electrode 244 can be made of titanium or gold. In one embodiment, the second electrode 244 includes two layers, one layer is titanium and has a thickness of 15 nm and another layer is gold and has a thickness of 200 nm. At least a portion of the carbon nanotube structure is located between the static electrode 240 and the second electrode 244. The second electrode 244 may be P-type or N-type electrode and is the same type as the static electrode 240 and the second semiconductor layer 236. Since the static electrode 240 is made of P-type material, the second electrode 244 is a P-type electrode. When the LED 20 has the static electrode 240, the second electrode 244 should be located above the static electrode 240. When the LED has no static electrode 240, the second electrode 244 can be located at any position on the transparent conductive layer 250. In one embodiment, since the LED employs the static electrode 240, the second electrode 244 is located above the static electrode 240. The second electrode 244 and the static electrode 240 function together as the P-type electrode of the LED.

The second electrode 244 is a same polarity type with the first semiconductor layer 236 and may be made of N-type material. The second electrode 244 is deposited on the second surface 264 of the first semiconductor layer 236. The second electrode 244 has a same structure as the first electrode 242 and includes a titanium layer and a gold layer stacked on the titanium layer. The titanium layer has a thickness of about 15 nm and the gold layer has a thickness of about 200 nm. The method of depositing the second electrode 244 can be the same as that of the first electrode 242. The first and second electrodes 242, 244 can be deposited at the same time.

Figure 4:
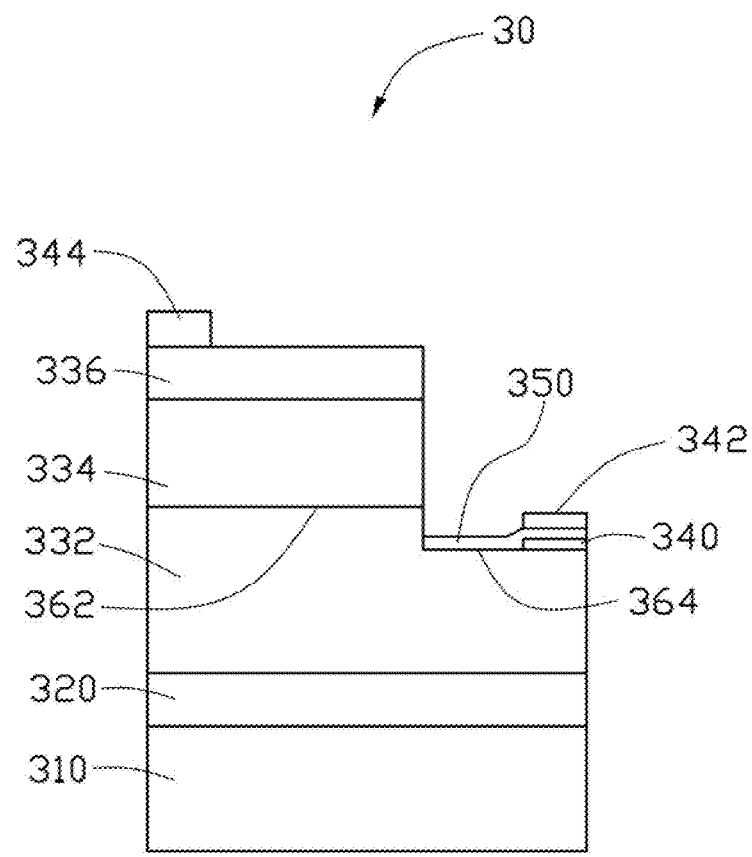
FIG. 4 is a schematic view of a light emitting diode according to an another embodiment.

Referring to FIG. 4, in one embodiment, an LED 30 includes a substrate 310, a buffer layer 320, a first semiconductor layer 332, an active layer 334, a second semiconductor layer 336, a first electrode 342, a second electrode 344, a transparent conductive layer 350, and a static electrode 340. The buffer layer 320, the first semiconductor layer 332, the active layer 334, the second semiconductor layer 336 are orderly stacked on the substrate 310.

The first semiconductor layer 332 includes a first surface 362 and a second surface 364 located on the same side as the first surface 362. The first surface 362 and the second surface 364 have different heights and form a stepped structure. The active layer 334 and the second semiconductor layer 336 are disposed on the first surface 362. The transparent conductive layer 350 is disposed on the second surface 364 of the first semiconductor layer 332 and electrically connected to the first semiconductor layer 332. Further, the static electrode 340 is interposed between the first semiconductor layer 332 and the transparent conductive layer 350. The first electrode 342 is disposed on the top surface of the transparent conductive layer 350 and electrically connected to the transparent conductive layer 350. The second electrode 344 is electrically connected to the second semiconductor layer 336.

Figure 5:
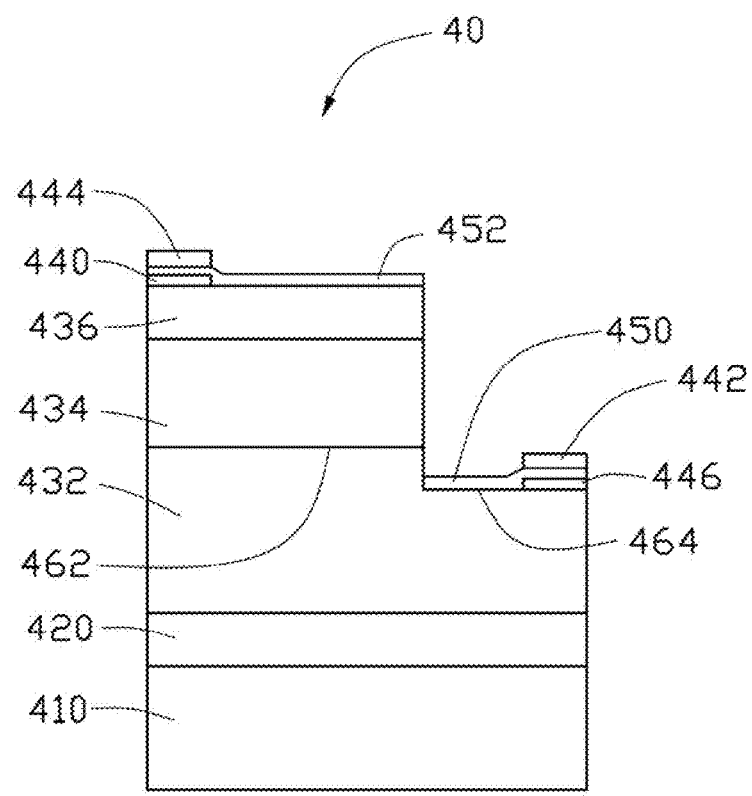
FIG. 5 is a schematic view of a light emitting diode according to an embodiment.
Figure 6:
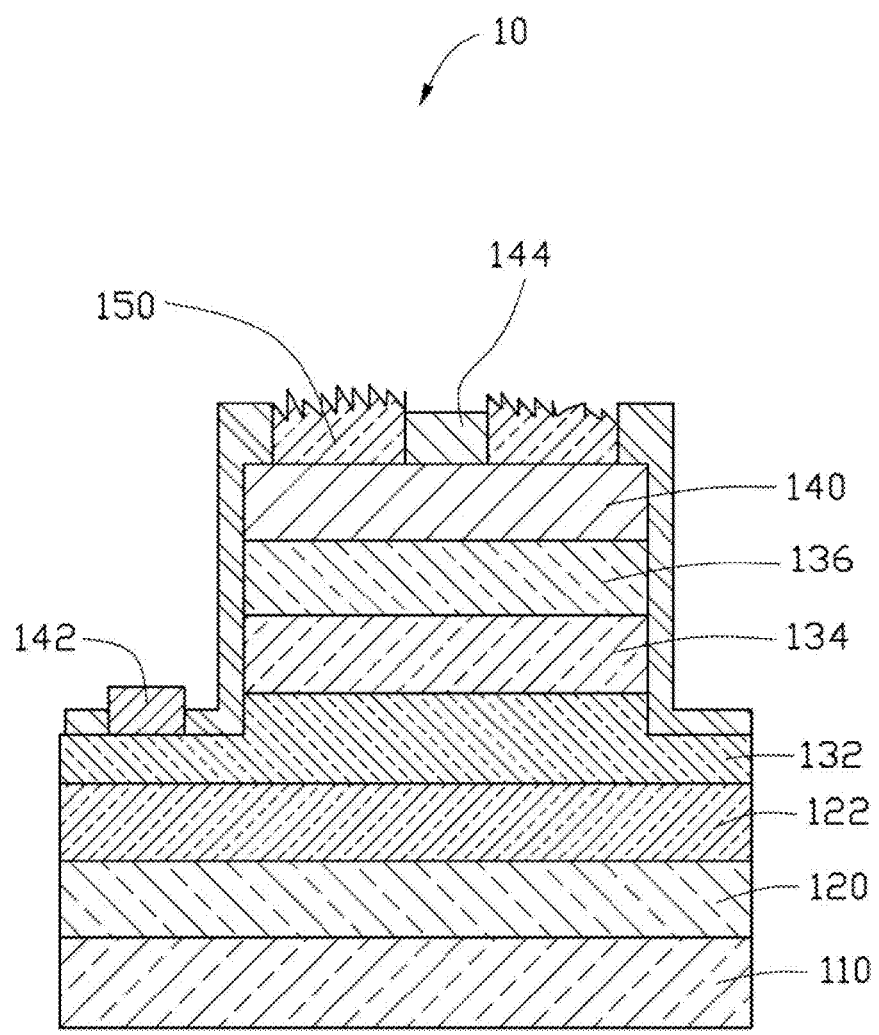
FIG. 6 is schematic, cross-sectional view of a typical light emitting diode according to prior art.

Referring to FIG. 5, in one embodiment, an LED 40 includes a substrate 410, a buffer layer 420, a first semiconductor layer 432, an active layer 434, a second semiconductor layer 436, a first electrode 442, a second electrode 444, a first transparent conductive layers 450, a second transparent conductive layer 452, and a first static electrode 440, a second static electrode 446. The buffer layer 420, the first semiconductor layer 432, the active layer 434, the second semiconductor layer 436 are orderly stacked on the substrate 310.

The first semiconductor layer 432 includes a first surface 462 and a second surface 464 located on the same side a the first surface 462. The first surface 462 and the second surface 464 have different heights and form a stepped structure. The second transparent conductive layer 452 is mounted on the second semiconductor layer 436, and the first transparent conductive layer 450 is mounted on the second surface 464 of the first semiconductor layer 432. Further, the first static electrode 440 is located between the second semiconductor layer 436 and the second transparent conductive layer 452, and the second electrode 444 is disposed on the top surface of the second transparent conductive layer 452. The second static electrode 446 is interposed between the first semiconductor layer 436 and the first transparent conductive layer 450, and the first electrode 442 is disposed on the top surface of the first transparent conductive layer 450.

Since the carbon nanotubes have better electrical conductivity and mechanical strength than conventional material, such as indium tin oxide, the carbon nanotube structure has better electrical conductivity and mechanical strength, thereby improving power efficiency and life span. Further, the carbon nanotube structure is transparent in varied humid environments. Therefore less of the light emitted by the active layer is absorbed. Thus, the LED has good extraction efficiency in comparison with the typical LED.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A light emitting diode comprising:
   a substrate;
   a first semiconductor layer located on the substrate, wherein the first semiconductor layer is a stepped structure comprising a first surface and a second surface lower than the first surface;
   an active layer located on the first surface of the first semiconductor layer;
   a second semiconductor layer located on the active layer;
   a first electrode located on the second surface of the first semiconductor layer and electrically connected to the first semiconductor layer;
   a transparent conductive layer located on and electrically connected to the second semiconductor layer, wherein the transparent conductive layer comprises a carbon nanotube structure;
   a second electrode located on and electrically connected to the transparent conductive layer; and
   a static electrode located between the second semiconductor layer and the carbon nanotube structure, wherein the carbon nanotube structure comprises a first portion in direct contact with the second semiconductor layer and a second portion sandwiched between the static electrode and the second electrode, and the static electrode is a continuous metal layer; wherein the static electrode and the second electrode have a same shape and area and completely overlap with each other.

2. The light emitting diode of claim 1, wherein the carbon nanotube structure is a free-standing structure.

3. The light emitting diode of claim 1, wherein the carbon nanotube structure comprises a carbon nanotube film.

4. The light emitting diode of claim 3, wherein the carbon nanotube film comprises a plurality of carbon nanotubes joined end-to-end by van der Waals attractive force therebetween and substantially parallel to each other.

5. The light emitting diode of claim 4, wherein the carbon nanotube structure comprises two carbon nanotube films stacked with each other, and an angle between aligned directions of carbon nanotubes of the two carbon nanotube films is about 90 degrees.

6. The light emitting diode of claim 3, wherein the carbon nanotube film comprises a plurality of carbon nanotubes entangled with one another.

7. The light emitting diode of claim 1, wherein the carbon nanotube structure comprises a plurality of twisted carbon nanotube wires, and each of the plurality of twisted carbon nanotube wires comprise a plurality of carbon nanotubes helically wrapped around a longitudinal axis of each of the plurality of twisted carbon nanotube wires.

8. The light emitting diode of claim 1, wherein the carbon nanotube structure comprises a plurality of untwisted carbon nanotube wires, each of the plurality of untwisted carbon nanotube wires comprise a plurality of carbon nanotubes substantially parallel to each other and a longitudinal axis of each of the plurality of untwisted carbon nanotube wires.

9. The light emitting diode of claim 1, wherein the transparent conductive layer further comprises a plurality of metal particles dispersed in the carbon nanotube structure.

10. The light emitting diode of claim 1, wherein the static electrode comprises a material selected from the group consisting of titanium, aluminum, nickel, and gold.

11. The light emitting diode of claim 1, wherein the static electrode comprises a titanium layer and a gold layer.

12. The light emitting diode of claim 11, wherein a thickness of the titanium layer is about 15 nanometers, and a thickness of the gold layer is about 100 nanometers.

13. The light emitting diode of claim 1, wherein the static electrode and the second electrode have a same type and function together as a P-type electrode or a N-type electrode.

14. A light emitting diode comprising:
a substrate;
a first semiconductor layer located on the substrate, wherein the first semiconductor layer comprises a first surface and a second surface connected to the first surface;
an active layer located on the first surface of the first semiconductor layer so that the second surface is exposed;
a second semiconductor layer located on the active layer;
a first electrode located on the second surface of the first semiconductor layer and electrically connected to the first semiconductor layer;
a carbon nanotube layer located on and electrically connected to the second semiconductor layer;
a second electrode located on and electrically connected to the carbon nanotube layer; and
a static electrode located between the second semiconductor layer and the carbon nanotube layer, wherein the carbon nanotube layer comprises a first portion in direct contact with the second semiconductor layer and a second portion sandwiched between the static electrode and the second electrode, and the static electrode is a continuous metal layer; wherein the static electrode and the second electrode have a same shape and area and completely overlap with each other.

15. The light emitting diode of claim 14, wherein the static electrode and the second electrode have a same type and function together as a P-type electrode or a N-type electrode.

16. A light emitting diode comprising:
a first semiconductor layer;
an active layer located on the first semiconductor layer;
a second semiconductor layer located on the active layer;
a first electrode located on and electrically connected to the first semiconductor layer;
a carbon nanotube layer located on and electrically connected to the second semiconductor layer;
a second electrode located on and electrically connected to the carbon nanotube layer; and
a static electrode located between the second semiconductor layer and the carbon nanotube layer, wherein the carbon nanotube layer comprises a first portion in direct contact with the second semiconductor layer and a second portion sandwiched between the static electrode and the second electrode, and the static electrode is a continuous metal layer; wherein the static electrode and the second electrode have a same shape and area and completely overlap with each other.

17. The light emitting diode of claim 16, wherein the static electrode and the second electrode have a same type and function together as a P-type electrode or a N-type electrode.

* * * * *